(12) United States Patent
Bakalski

(10) Patent No.: US 7,486,133 B2
(45) Date of Patent: Feb. 3, 2009

(54) TRANSMITTING OUTPUT STAGE WITH ADJUSTABLE OUTPUT POWER AND PROCESS FOR AMPLIFYING A SIGNAL IN A TRANSMITTING OUTPUT STAGE

(75) Inventor: Winfried Bakalski, München (DE)

(73) Assignee: Infineon Technologies AG, Munich (DE)

( * ) Notice: Subject to any disclaimer, the term of this patent is extended or adjusted under 35 U.S.C. 154(b) by 125 days.

(21) Appl. No.: 11/584,319

(22) Filed: Oct. 20, 2006

(65) Prior Publication Data

US 2007/0096804 A1 May 3, 2007

(30) Foreign Application Priority Data

Oct. 21, 2005 (DE) .................. 10 2005 050 622

(51) Int. Cl.
*H03F 3/191* (2006.01)

(52) U.S. Cl. .................. 330/51; 330/295; 330/302

(58) Field of Classification Search ............... 330/51, 330/302; 455/127.3
See application file for complete search history.

(56) References Cited

U.S. PATENT DOCUMENTS 7,135,919 B2 * 11/2006 Chen ....................... 330/51

FOREIGN PATENT DOCUMENTS

DE 101 36 624 A1 2/2003
DE 102 11 609 A1 10/2003

OTHER PUBLICATIONS

"High-Linearity RF Amplifier Design", Peter B. Kenington, Artech House Microwave Library, 2000, 13 pgs.
"Linear RF CMOS Power Amplifier with Improved Efficiency and Linearity in Wide Power Levels", N. Srirattana, P. Sen, H.-M. Park, C.-H. Lee, P.E. Allen and J. Laskar, IEEE, 2005, 4 pgs.
"Applying Switched Gain Stage Concepts to Improve Efficiency and Linearity for Mobile CDMA Power Amplification", J. Staudinger, Microwave Journal, Sep. 2000, 12 pgs.

* cited by examiner

*Primary Examiner*—Steven J Mottola
(74) *Attorney, Agent, or Firm*—Eschweiler & Associates LLC

(57) ABSTRACT

In one embodiment of a transmitting output stage, a first controllable amplification device with a first amplification factor and a second amplification device with a second amplification factor are provided. The two amplification devices are connected on the input side to a signal input. The transmitting output stage comprises a first matching network, which is connected on the input side to an output of first amplification device. A second matching network is also provided, which is installed switchably between an output of the second amplifier stage and the input of the first matching network and which, in one operating mode of the transmitting output stage in which only the second amplifier stage is being used, is connected between the second amplifier stage and the first matching network. Other embodiments are also disclosed.

21 Claims, 6 Drawing Sheets

TRANSMITTING OUTPUT STAGE WITH ADJUSTABLE OUTPUT POWER AND PROCESS FOR AMPLIFYING A SIGNAL IN A TRANSMITTING OUTPUT STAGE

REFERENCE TO RELATED APPLICATIONS

This application claims the benefit of the priority date of German application DE 10 2005 050 622.4, filed on Oct. 21, 2005, the contents of which are herein incorporated by reference in their entirety.

BACKGROUND OF THE INVENTION

The invention pertains to a transmitting output stage with adjustable output power and to a process for amplifying a signal in a transmitting output stage.

In modern mobile communications systems, an especially long so-called "stand-by" time is desirable. This term is used for the time during which a mobile communications unit can remain in an active or ready-to-receive state without the need to recharge the battery required for operation. This can be contrasted with the "talk" time, which is the length of time during which continuous transmission or reception is can proceed in the mobile communications device. Customer demand for increasing stand-by and talk times requires not only new types of batteries with higher capacity but also the most efficient possible reduction of the power consumption of the mobile communications device in its various operating modes.

One possibility includes reducing the transmitting power of the mobile communications device, because this has the effect of reducing the power consumption of the amplifier, which makes a major contribution to overall power consumption. Reducing the transmitting power is also a logical option especially when the mobile communications device is located near a base station, because in such cases a low output power is sufficient for satisfactory signal reception. As a result, the current uptake and thus the power consumption can be lowered. As provided in the mobile radio standard UMTS, for example, the base station can instruct the mobile communications device to increase or to decrease its transmitting power.

In modern mobile radio standards such as WCDMA/UMTS, WLAN, or IS95, the data to be transmitted are modulated with respect to both the amplitude and the phase of the signal. As a result, the input amplitude in a power amplifier of the mobile communications device changes over time. The average output power of the mobile communications device is adjusted in turn by regulation of the power amplifier.

FIG. 1 shows a probability density function for a mobile radio standard of this type. It is easy to see that the probability for the output power of a typical high-frequency signal is in the area of 10 dBm. Nevertheless, there is also a relatively high probability for very high output powers of +20 dBm to +30 dBm. As a result, the amplifiers in the transmission path typically fulfill the requirement of having a sufficiently linear transmission behavior over the entire output power range and especially at these high power levels. Otherwise, there will be distortions in the amplitude and in the phase of the signal during the transmission of signals at high output power levels. As a result, transmission errors can be caused, and the data error rate will increase sharply.

To guarantee that the mobile communications device will also provide sufficient transmitting power even when the base station is a long distance away, the output stage of the transmission path and the high-frequency power amplifiers in the output stage are designed for the maximum case which can occur. The power amplifiers in the output stage, however, cannot be equally efficient for every possible input power. FIG. 2 shows a typical curve of the output power as a function of the input power in comparison with the curve of the overall efficiency of the power amplifier versus the input power (PAE, Power Added Efficiency). The efficiency is obtained by dividing the difference between the output power and the input power by the overall power consumption of the amplifier.

It can be seen from the two curves that, at low input power, the efficiency of the power amplifier is not linear; instead, it decreases much more quickly than linear behavior would demand and almost disappears around an input power of −20 dBm. The reason for this is that, at low input levels, the efficiency is determined primarily by the idling current which flows through the power amplifiers in the transmitting output stage. These currents can be decreased only in a certain range, because otherwise the amplifiers will not have a linear characteristic and thus will no longer provide proportional amplification.

There are various approaches which can be taken to solve this problem. They include the one described by J. Staudinger in "Applying Switched Gain Stage Concepts to Improve Efficiency and Linearity for Mobile CDMA Power Amplification" (*Microwave Journal*, September 2000), in which the output stage is bypassed by a bypass line so that a multi-stage amplifier coming right after a driver stage can be connected to the output of the transmitting output stage.

BRIEF DESCRIPTION OF THE FIGURES

The invention is explained in detail below with the help of the drawings, which illustrate various exemplary embodiments.

SUMMARY OF THE INVENTION

Figure 1:
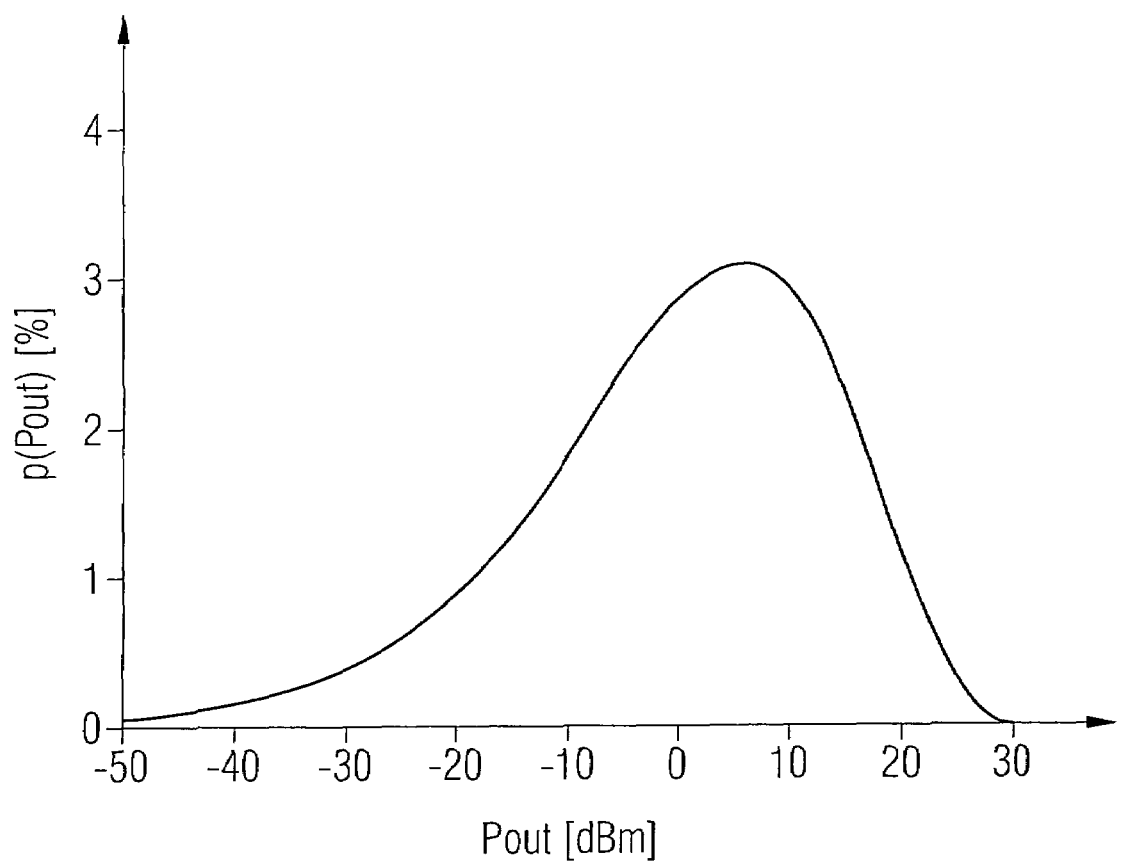
FIG. 1 shows a diagram of a probability density versus the output power.

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In one embodiment, a transmitting output stage is provided with a signal input and a first controllable amplification device, which is connected on the input side to the signal input. A second amplification device is also connected to the signal input. The transmitting output stage also comprises a first matching network, which is connected on the input side to an output of the first amplification device. A second matching network is connected on the input side to an output of the second amplification device and is connected on the output side to a node between the first amplification device and the first matching network. The second matching network has at least one matching element.

In a first operating mode in which only the second amplifier stage is used, it is provided in the transmitting output stage that the second matching network can be connected between the second amplifier stage and the first matching network.

In one possible embodiment, for example, the second matching network can have a device for the optional suppression of the matching element, at least one of which is provided. Alternatively, the device can be designed to allow the optional deactivation of the minimum of one matching element or to change the impedance property of the matching element.

Thus, as a function of the operating mode of the transmitting output stage, either the outputs of the first and second amplifier stages can advantageously be connected directly to the first matching network, or the output of the second amplifier stage can be connected via the second matching network to the first matching network. This makes it possible to match the impedance of the output of the second amplifier stage when the transmitting output stage is operating with only the second amplifier stage.

Because, at low output powers, the efficiency of the transmitting output stage is determined primarily by the idling current flowing through the individual amplifier stages, it is provided according to the proposed principle of the invention that, depending on the selected operating mode, the load impedance at the output of the amplifier stage being used at the time in question is matched as perfectly as possible. As a result, the idling current of the amplifier stage being used can be decreased, and good impedance matching and thus high efficiency can be achieved at the same time. In addition, the linearity of the transmission behavior of the output stage is improved even more for the operating mode in question.

In one possible embodiment of the invention, the first controllable amplification device can accordingly have a high maximum output power, and the second amplification device can have a lower maximum output power. Thus, when the first and the second amplifier stages are being operated simultaneously, the transmitting output stage is set up for high overall output power levels; and when only the second amplifier stage is being operated, it is set up for lower overall output power levels.

The first controllable amplifier device can be set up for a low maximum output power and the second amplifier device for a high maximum output power. Under one aspect of the invention, the first amplification device has a high amplification factor, whereas the second amplification device has a low amplification factor.

In one embodiment of the invention, therefore, the first matching network is designed for matching to low load impedances. The second matching network serves to transform a low load impedance to a high load impedance.

Under another aspect of the invention, the transmitting output stage has a control input, which is connected to the first controllable amplification device. A control signal for deactivating the first controllable amplifier stage can be sent to this control input. Such deactivation can be accomplished by way of, for example, a change in the signal which sets the working point. Thus the transmitting output stage can be operated in at least two different modes with different transmission amplifications.

Under another aspect of the invention, the device for optionally bridging the second matching network comprises a switch, which is inserted in a signal path parallel to the second matching network. In a different possible embodiment of the invention, the device has a transistor, which is located between a reference potential terminal and the second matching network. A switching signal for bridging the second matching network can be sent to the base terminal of this transistor. Again, in another embodiment of the invention, the second matching network contains an inductive element and a capacitive element connected in parallel to the inductive element. A node between the inductive element and the capacitive element is connected to the output of the second amplification device. The second matching network thus transforms a low load impedance of the first matching network to a high input impedance.

Under one aspect of the invention, the first controllable amplification device, the second amplification device, and the second matching network are designed as an integrated circuit in a semiconductor body. The first matching network is connected to a contact point on the surface of the semiconductor body. This connection can be executed by means of a bonding wire, which simultaneously forms part of a matching element of the first matching network. This aspect can reduce the amount of space required and lead to greater fabrication density.

It is possible according to the invention for the second amplification device to be active at all times during operation. As a result, no additional amplifier transistors and thus no additional surface-area on a semiconductor substrate are required to make essential changes in the amplification setting or to operate the transmitting output stage at low output power. The realization of the second amplification stage as an integrated circuit within the semiconductor body allows the continued use of preexisting external wiring.

In a process for a amplifying a signal in a transmitting output stage, therefore, a signal is made available, and then an amplification setting is selected. Impedance matching is carried out as a function of the selected amplification device. The signal provided is then amplified by the selected amplification factor.

When a change is made to the amplification setting, it is also possible to change the impedance matching by bridging an element responsible for the impedance matching. As a result of this bridging or as a result of the additional transformation of the impedance as a function of the amplification setting, the current consumption of a transmitting output stage can be reduced, and the signal properties can be improved during the amplification process.

When, for example, the amplification setting is selected at a value below a predetermined limit, impedance matching can be carried out by transforming a low input impedance to a high load impedance. Correspondingly, a high impedance is transformed to a low impedance when the amplification setting is set to a value above the predetermined limit.

The following description and annexed drawings set forth in detail certain illustrative aspects and implementations of the invention. These are indicative of but a few of the various ways in which the principles of the invention may be employed.

DETAILED DESCRIPTION

Additional aspects and embodiments of the present invention are set forth in the following description. In addition, reference is made to the accompanying figures, which form a part of the description and in which it is shown through diagrams how the invention can be implemented in practice. The embodiments shown in the drawings represent a summary, which make it possible to understand one or more aspects of the present invention more clearly. Further, the various elements, aspects, and features which are disclosed in the exemplary embodiments can be combined in various ways by persons of ordinary skill in the art to achieve one more inventive advantages. It should be understood that other embodiments could be used and that structural or logical changes could be made without abandoning the core ideas of the present invention. The elements in the drawings are not necessarily drawn to scale with respect to each other.

Figure 3A:
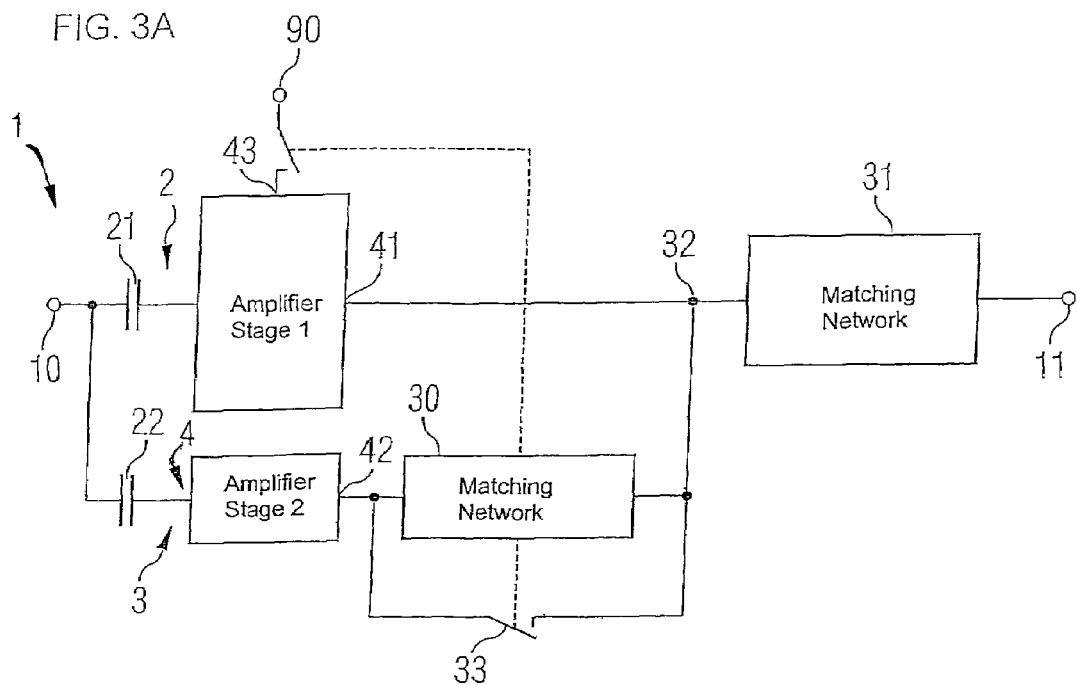
FIG. 3a shows a first block circuit diagram of an embodiment of the invention.

To illustrate one embodiment, FIG. 3a shows one embodiment of a block circuit diagram of a transmitting output stage 1. The illustrated transmitting output stage 1 comprises a first amplifier stage 2 and a second amplifier stage 4. In this example, which is not intended to be limiting in any way, the first amplifier stage 2 is designed for operation at high output power levels. The second amplifier stage 4 is used for low output powers. The first amplifier stage 2 has an input side that is connected to a high-frequency signal input 10 by way of a capacitor 21. In the same way, the second amplifier stage 4 has an input side that is connected to the high-frequency signal input 10 by way of a capacitor 22. An output 41 of the first amplifier stage 2 is connected to a first matching network 31. The first matching network 31 serves to transform an output impedance at the output terminal 11 to the lowest possible input impedance in the range of a few ohms. As a result, when the inventive transmitting output stage is operating at high output power, the first amplifier stage 2 can be operated in a range of its characteristic suitable for these power levels.

Another matching network 30 is connected to the output terminal 42 of the second amplifier stage 4. An output of this network is connected to a node 32, which is situated between the output 41 of the first amplifier stage 2 and the input of the first matching network 31.

In addition, a so-called "bridging path" is provided parallel to the matching elements 30 of the matching network 3. This bridging path comprises a switch 33, which can be set to the proper position by a control signal sent to the control input 90. The control input 90 is also connected to a regulating control input 43 of the amplifier stage 1.

To facilitate operation of the transmitting output stage at high output power levels, the first amplifier stage 2 and the second amplifier stage 4 are both activated. In this mode, it is advisable for the impedance at the output terminal 11 to be transformed by the first matching network to the lowest possible input impedance. In this situation, the outputs 41 and 42 of the amplifier stages 2 and 4 thus "see" a low input impedance in the range of a few ohms.

At low output power levels, however, the first amplifier stage 2 in the inventive transmitting output stage is deactivated by an appropriate control signal at the control input 43. The transmitting output stage is therefore operating now only with the second amplifier stage 4 for low output power. In order for the process can be carried out efficiently, suitable matching can be provided for the output 42 of the second transmitting output stage.

Figure 2:
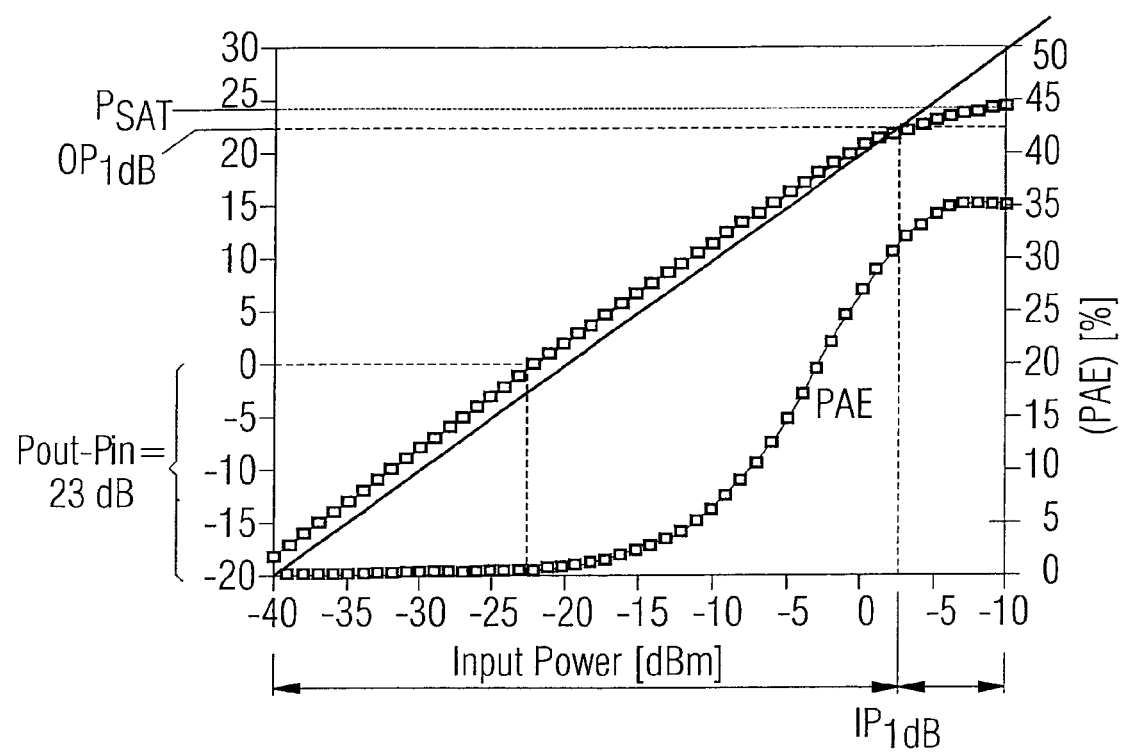
FIG. 2 shows a power characteristic illustrating the change in efficiency versus the input power.

This can be derived from the schematic diagram of the overall efficiency according to FIG. 2. It can be seen that, in the range of high input powers, the change in efficiency such as that which might be caused by poor matching is rather small. It follows from this that the second transmitting output stage is also to be operated with the highest possible input powers with good impedance matching at the same time. The input impedance of a few ohms generated by the matching network 31, however, is too low for the amplifier stage 4 to operate efficiently at low output power levels. At this load, therefore, the transmitting output stage would operate in an inefficient range with a definitely nonlinear characteristic.

To prevent this, an additional, i.e., a second, matching network is provided. This serves to transform the input impedance of the first matching network 31 to a higher impedance in the range of several tens of ohms. For example, the second matching network transforms an input impedance in the range of 3 ohms back up to 40 ohms. For operation at low output powers, therefore, the switch 33 in the parallel bridging path is opened, which has the effect of activating a back-transformation by the second matching network. Simultaneously, the control signal at the control input 90 turns off the first amplifier stage 1.

When, conversely, the inventive transmitting output stage is operating at high output power, the first and second amplifier stages 2, 4 are both activated, and the switch 33 is closed. As a result, no additional transformation occurs in the second matching network by the matching elements 30. Although FIG. 3A has been discussed with reference to a first amplifier stage 2 that is high-power and a second amplifier stage 4 that is low-power, the respective levels of the first and second amplifier stages 2, 4 could also be reversed in other embodiments.

Figure 3B:
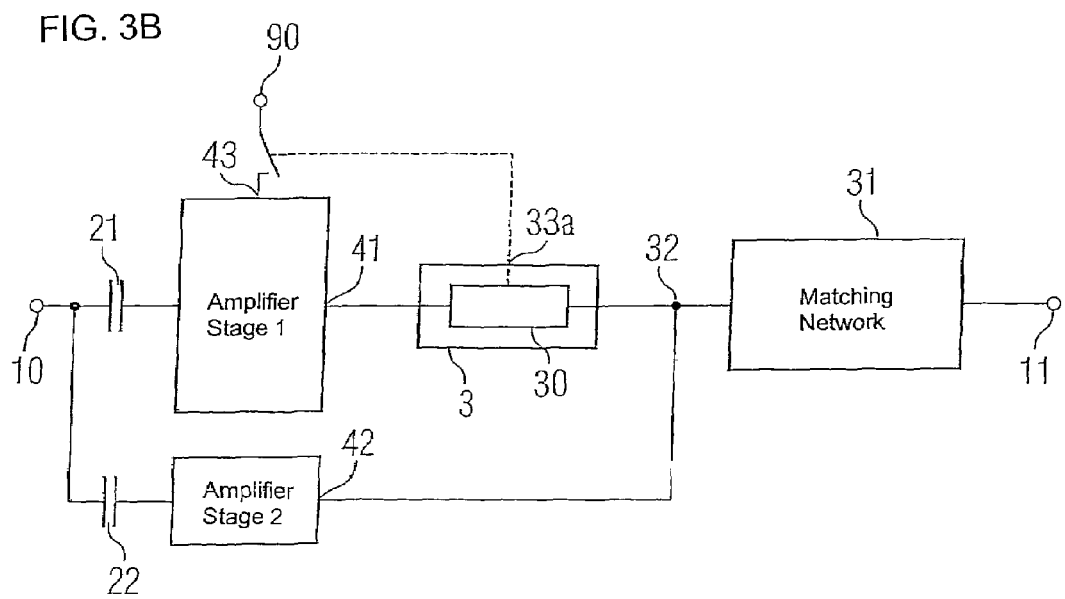
FIG. 3b shows a second block circuit diagram of an embodiment of the invention.

FIG. 3b shows another embodiment. Components which are the same with respect to effect and/or function are designated by the same reference symbols. In this embodiment, the output of the second amplifier stage 4 is connected directly to the node 32 and thus to the first matching network 31. The second matching network 3 is installed between the output of the first amplifier stage 2 and the input of the node 32. It also has a matching element 30. In this embodiment, this element serves to match the input impedance of the first network to the output of the first amplifier stage. The matching element 30 can be turned off by the device 33a, so that, in the turned-off state, no impedance change is performed by the device. In a first operating mode, therefore, both amplifier devices 1, 4 are activated. In addition, the first matching network is matched by the matching element 30 of the second matching network to the output of the first amplifier stage 1. In the second operating mode, the first amplifier stage 2 and the matching element 30 are turned off. A signal is now amplified by the second amplifier stage, where the matching network 31 is matched to the output of the second amplifier stage.

Figure 4:
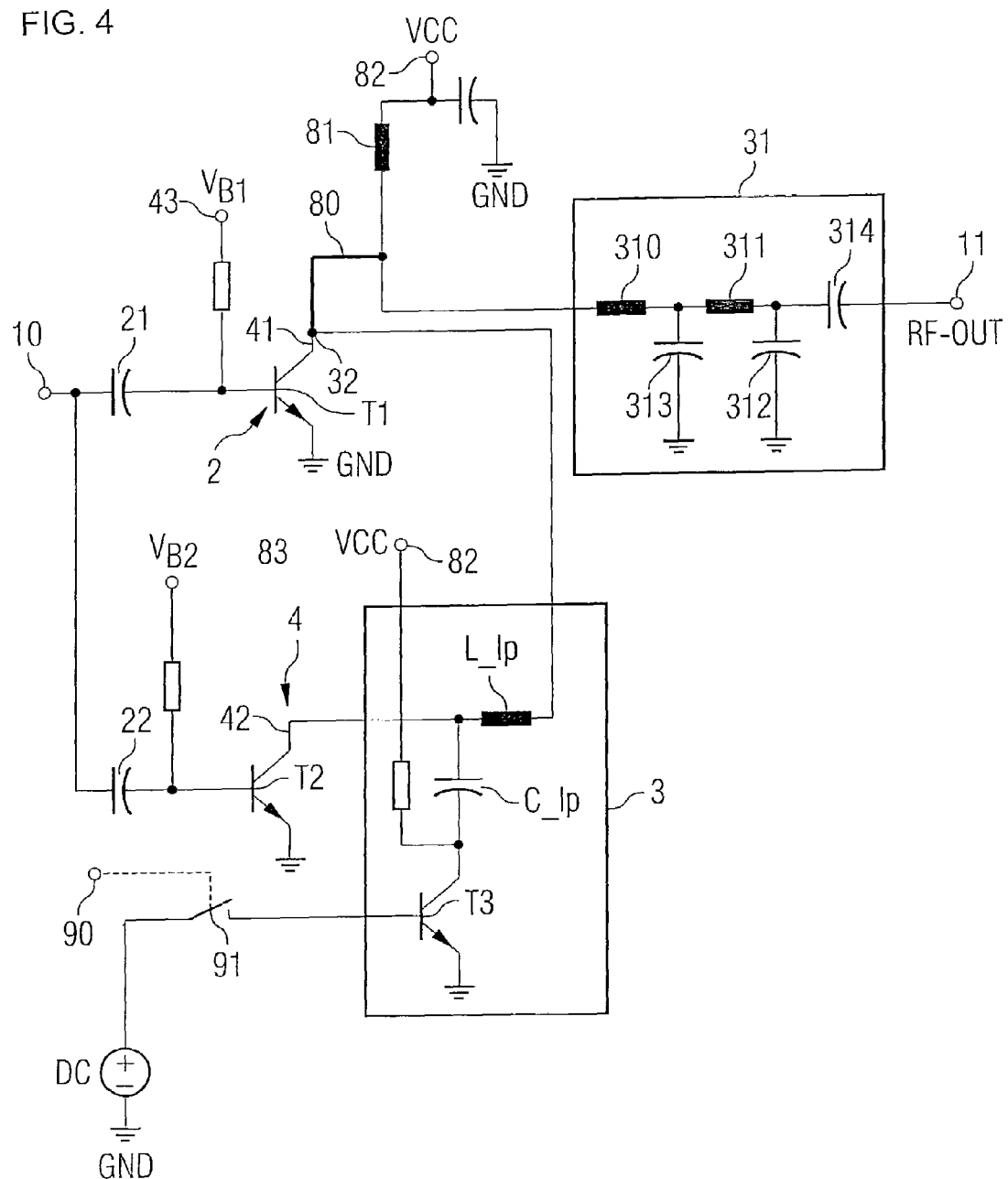
FIG. 4 shows a first exemplary embodiment of an inventive transmitting output stage.

FIG. 4 shows another embodiment of a transmitting output stage. Components which are the same with respect to effect and/or function are designated by the same reference symbols. In this embodiment, the first amplifier stage 2 is designed with a bipolar transistor T1. This transistor is designed for amplification with high output power levels. In a corresponding manner, another bipolar transistor T2 is provided in the amplifier stage 4. The emitter surfaces of the two transistors T1, T2 of the two amplifier stages 1, 4 are in a well-defined ratio to each other. They, together with the operating voltage, determine the output power, among other things. The ratio between the amplification of amplifier stage 2 to that of amplifier stage 4 is set by this area ratio. In the present case, the emitter surface of the transistor T1 is 5 times larger than the emitter surface of the transistor T2. Thus the amplification of the amplifier stage 2 is also higher than that of the amplifier stage 4 by the same factor.

Each of the base terminals of the two transistors T1, T2 is connected to the high-frequency terminal 10 by way of a capacitor 21, 22. So that the working point can be adjusted or so that the transistors T1, T2 can be activated and deactivated, each of the base terminals is also connected by way of a resistor to a terminal via which a potential is supplied. The two potentials $V_{B1}$ and $V_{B2}$ serve to set the working point of the transistors T1, T2.

The collector terminal of the transistor T1 of the first amplifier stage 2 is connected to a supply potential terminal 82 by a bonding wire 80 and a coil 81. The supply potential VCC for supplying the first amplifier stage 2 and the first transistor T1 is applied at the terminal 82. The bonding wire 80 has a certain inductance. The first matching network 31, which comprises two series-connected chokes 310, 311 and a coupling capacitor 314, is also connected to the bonding wire 80. The second terminal of the coupling capacitor is connected to the high-frequency output terminal 11. Each of the chokes 310, 311, furthermore, is connected to the reference potential GND by way of a capacitor 313, 312.

The collector terminal of the transistor T2 also forms the node 42, which is connected to the second matching network 3. In this embodiment, the second matching network comprises a coil L_lp and a series-connected capacitor C_lp. A node between the coil L_lp and the capacitor C_lp is connected to the output 42, i.e., to the emitter terminal, of the transistor T2 of the second amplifier stage 4. The second terminal of the capacitor C_lp is connected by way of a resistor to the supply potential terminal 82 and to the collector of a switching transistor T3. The reference potential GND is connected to the emitter of the switching transistor T3. The base terminal of the switching transistor T3 is connected by way of a switch to a DC voltage source. This switch is driven by a control signal supplied at the control input 90.

When the transmitting output stage is to operate at high output power, the first amplifier stage 2 and the second amplifier stage 4 are both activated. Simultaneously, the switch 91 is opened, as a result of which the switching transistor T3 is turned off. Thus the second terminal of the capacitor C_lp of the matching network 3 is pulled essentially to the supply potential VCC, as a result of which the matching network 3 is prevented from performing any impedance transformation. This means in practice that the second matching network is bridged. The result of turning off the switching transistor T3, thus preventing impedance transformation by the matching elements L_lp and C_CP, is to prevent a high voltage swing at the collector terminal 42 of the transistor T2. This voltage swing could otherwise lead to a collector-emitter breakdown in the transistor T2 and thus to its self-activation. That is, a high voltage swing across the collector-base capacitance of the transistor would induce an alternating signal at the base, causing the transistor to self-activate. The base-emitter diode becomes conductive and the transistor "turns on".

At low output powers, however, the bias potential $V_{B1}$ for setting the working point of the transistor T1 of the first amplifier stage 2 in the inventive transmitting output stage is turned off. As a result, the first amplifier stage 2 is deactivated. Simultaneously, the switch 91 is closed, and thus the switching transistor T3 is switched to a conductive state. As a result, the reference potential GND is supplied to the second terminal of the capacitor C_lp and thus impedance transformation is initiated in the second matching network. The load impedance present at the output 42 of the second amplifier stage 4 consists at this point of the impedance of the first matching network 31 and that of the series-connected second matching network 3.

Figure 5:
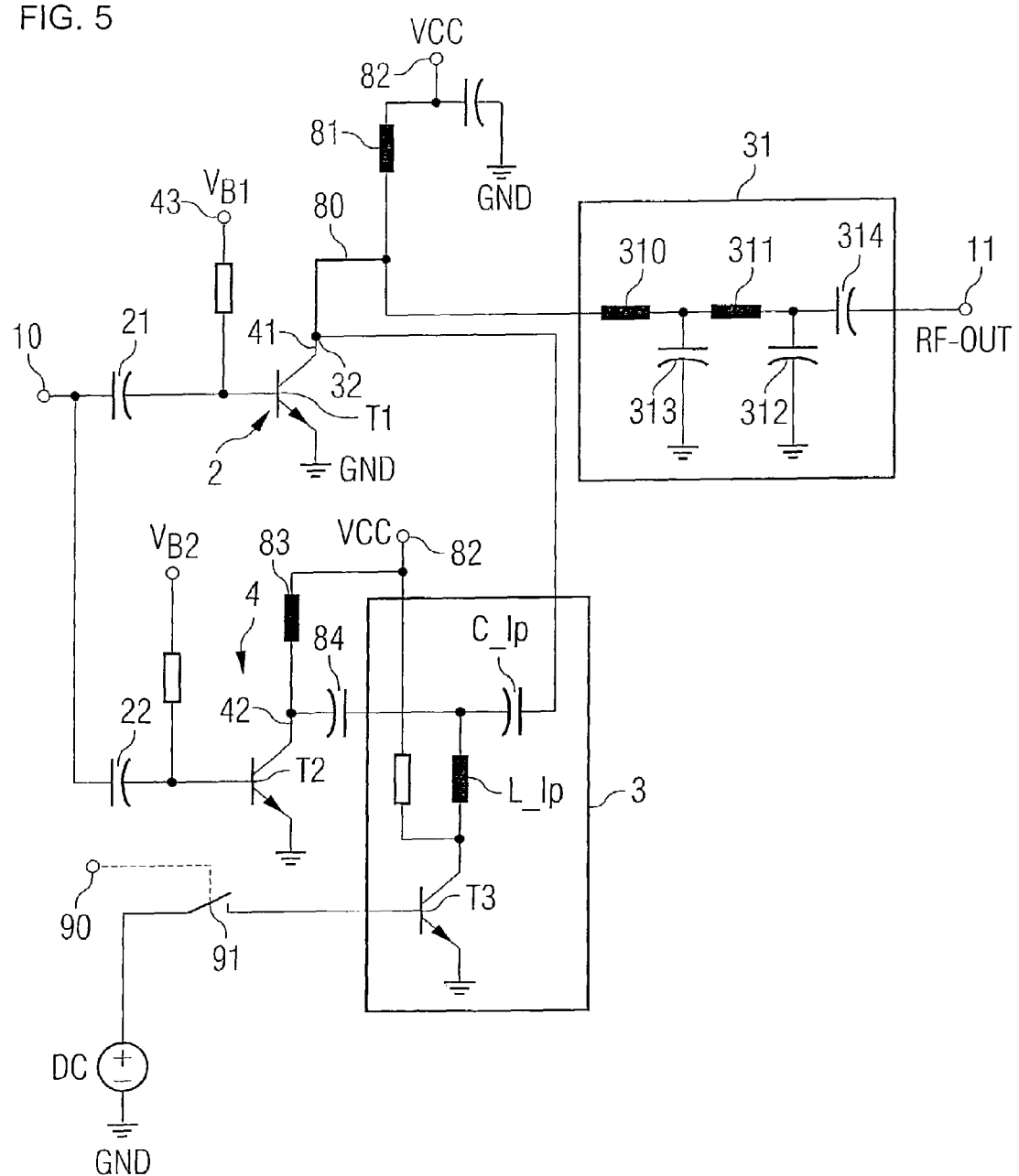
FIG. 5 shows a second exemplary embodiment of an inventive transmitting output stage.

The matching network 3 in the embodiment shown here is implemented in the present case by a low-pass filter consisting of the capacitor C_lp and the coil L_lp. The supply potential VCC can be provided as explained above via a resistor or via a coil. It is also possible to use a high-pass filter instead of the low-pass filter for the second matching network. This type of embodiment with a high-pass filter as the second matching network is shown in FIG. 5. Components which are the same with respect to effect and/or function are designated by the same reference symbols.

In this embodiment, the collector terminal of the transistor T2 of the second amplifier stage 4 is connected to the supply potential terminal 82 by way of a coil 83. The collector terminal of the transistor T2 is also connected to the matching network, specifically to the capacitor C_lp and the coil L_lp, by way of a capacitor 84. In this embodiment, the matching element of the matching network 3 is designed as a high-pass filter. The capacitor C_lp is thus installed between the node 32 and the collector terminal of the transistor T2. Between the capacitor 84 and the capacitor C_lp of the matching element, a node is connected to the first terminal of the coil L_lp. A second terminal of the coil L_lp is connected to the collector terminal of the switching transistor T3 and via a resistor to the supply potential terminal 82.

Figure 6:
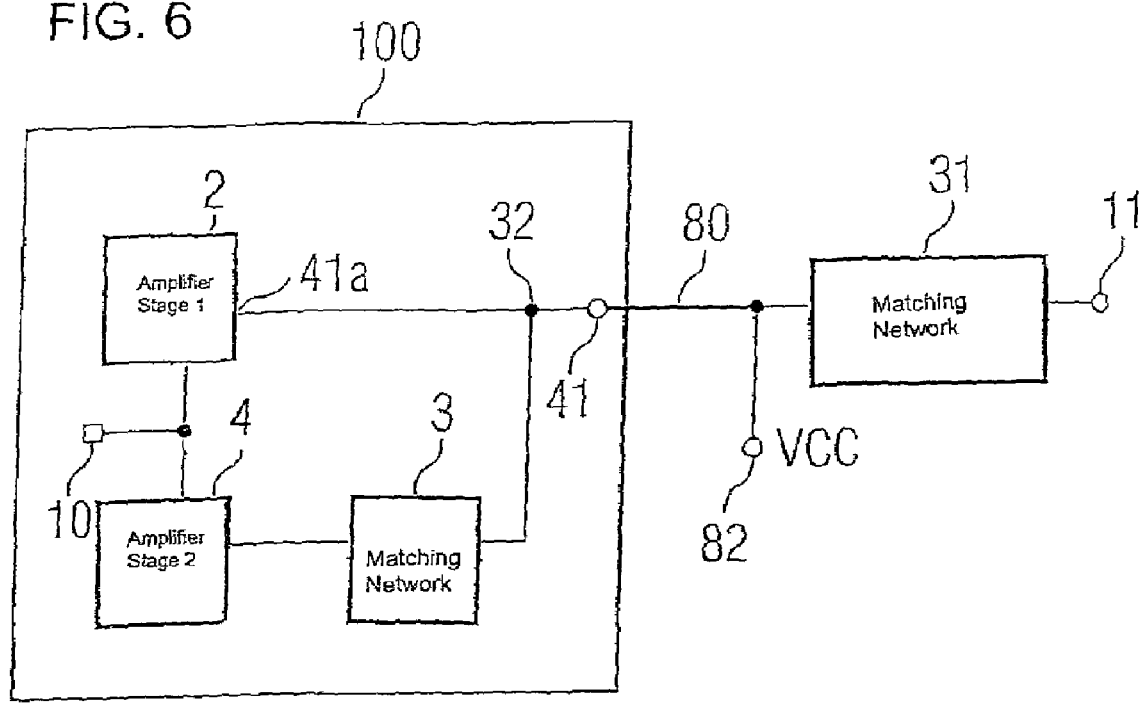
FIG. 6 shows an embodiment of an inventive transmitting stage in a semiconductor body.

FIG. 6 shows an implementation of the inventive transmitting output stage in a semiconductor body. The semiconductor body 100 has on its surface a plurality of contact points, only two of which are designated here by way of example. The first and the second amplifier stages 1, 4 and the second matching network 3 are designed as an integrated circuit in the semiconductor body. On the surface of the semiconductor body 100, a first contact point 10 is provided, which forms the high-frequency signal input. It extends inside the semiconductor body to the switching elements of the first and second amplifier stages 1, 4. The output 42 of the first amplifier stage 2 is also formed here by a contact point on the surface of the semiconductor body 100. Inside the semiconductor body, the contact point 41 is connected to an output terminal 41a and to the second matching network via the node 32.

A bonding wire 80, which is connected to the first matching network 31 and to the supply potential terminal 82, is connected to the contact point 41. The bonding wire 80 has a predetermined inductance. A predetermined ratio exists between this inductance and the inductance used in the matching network 3, so that the second matching network 3 is suitable for a back-transformation of a low load impedance to a high load impedance. The embodiment shown in FIG. 6 offers the advantage that the rest of the wiring, especially at the contact point 41, does not require any additional modification. In addition to the illustrated embodiments of the amplifier transistors of the individual amplifier stages as bipolar transistors, it is also possible to design them as field-effect transistors. The amplifiers can be made of any suitable semiconductor material, including GaAs, SiGe, Si, and even InP. It is also conceivable that the amplifier stages could be implemented as complementary field-effect transistors such as Complementary Metal Oxide Semiconductors (CMOS).

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A transmitting output stage with adjustable amplification, comprising:
    a signal input;
    a first controllable amplification device having a first amplification factor, wherein the first controllable amplification device has an input side connected to the signal input;
    a second amplification device having a second amplification factor, wherein the second amplification device has an input side connected to the signal input;
    a first matching network having an input side connected to an output of the first controllable amplification device;
    a second matching network having an input side connected to an output of the second amplification device and having an output side connected to a node between the first amplification device and the first matching network, the second matching network having at least one matching element and a device for selectively changing the impedance of at least the one matching element;
    where the second matching network comprises an inductive element and a series-connected capacitive element, where a node between the inductive element and the capacitive element is connected to the output of the second amplification device.

2. The transmitting output stage according to claim 1, where the device is configured so that the one matching element can selectively be bridged or deactivated.

3. The transmitting output stage according to claim 1, where the first controllable amplification device is configured to provide a high maximum output power level, and the second amplification device is configured to provide a low maximum output power level.

4. The transmitting output stage according to claim 1, where the first controllable amplification device is configured to provide a low maximum output power level, and the second amplification device is configured to provide a high maximum output power level.

5. The transmitting output stage according to claim 1, where the first controllable amplification device is designed with a high amplification factor, and the second amplification device is designed with a low amplification factor.

6. The transmitting output stage according to claim 1, where the first controllable amplification device comprises a control input, to which a control signal for deactivating the first controllable amplification device can be sent.

7. The transmitting output stage according to claim 6, where the control signal is used to set a working point of the first controllable amplification device.

8. The transmitting output stage according to claim 2, wherein the device for selectively bridging or deactivating further comprises a switch installed in a signal path parallel to the second matching network, where the switch facilitates the selective bridging or deactivating.

9. The transmitting output stage according to claim 1, where the device comprises: a transistor that is coupled between a reference potential terminal and the second matching network; where the transistor having a base terminal to which a switching signal for bridging the second matching network can be sent.

10. The transmitting output stage according to claim 1, where the second matching network is configured to transform a low impedance to a high impedance.

11. The transmitting output stage according to claim 1, where the first controllable amplification device and the second amplification device each comprise at least one amplification transistor, the amplification transistors having different geometric parameters that relate to a ratio that corresponds to the ratio between the first amplification factor and the second amplification factor.

12. The transmitting output stage according to claim 1, where the first controllable amplification device, the second amplification device, and the second matching network are implemented as an integrated circuit in a semiconductor body, and the first matching network is connected to a contact point on the surface of the semiconductor body.

13. A transmitting output stage with adjustable amplification, comprising:
    a signal input;
    a first amplifier stage having a first maximum output power;
    a second amplifier stage in parallel with the first amplifier stage, where the second amplifier stage has a second maximum output power that is different from the first maximum output power;
    a first matching network configured to match impedance to a load impedance during operation with the first and second amplifier stages, the first matching network having an input connected to the first amplifier stage;
    a second matching network that is switchably installed between an output of the second amplifier stage and the input of the first matching network, and where the second matching network is connected between the second amplifier stage and the first matching network during an operating mode of the transmitting output stage in which the second amplifier stage is being used while the first amplifier stage is deactivated;
    where in an operating mode of the transmitting output stage in which both the first and the second amplifier stages are being used, the first matching network is connected to the output of the second amplifier stage.

14. The transmitting output stage according to claim 13, where the first matching network is designed for matching to a low load impedance, and the second matching network is designed for matching to a high load impedance.

15. The transmitting output stage according to claim 13, where the first matching network is designed for matching to a high load impedance, and the second matching network is designed for matching to a low load impedance.

16. The transmitting output stage according to claim 13, where the transmitting output stage comprises a control input, to which a control signal can be sent to select a first operating mode or a second operating mode, the control input being connected to the first amplifier stage and to the second matching network.

17. The transmitting output stage according to claim 13, in which the first amplifier stage has a high amplification factor, and the second amplifier stage has a low amplification factor.

18. The transmitting output stage according to claim 13, where the second matching network, in the second operating mode of the transmitting output stage, is designed for transformation of a low impedance to a high impedance.

19. A process for amplifying a signal in a transmitting output stage, comprising:

preparing a signal;

selecting an amplification setting;

selecting an impedance matching as a function of the selected amplification setting;

amplifying the signal by the selected amplification factor;

changing the amplification setting;

changing the impedance matching by bridging elements responsible for the impedance matching;

where changing the impedance matching comprises at least one of the following:

transforming a low impedance to a high impedance when the amplification setting is adjusted to a value below a limit value;

transforming a high impedance to a low impedance when the amplification setting is adjusted to a value above a limit value.

20. The process according to claim 19, where the selection of an amplification setting comprises:

providing a first amplifier stage with a first amplification factor;

providing an amplifier stage with a second amplification factor;

selecting the first and the second amplifier stages or selecting the second amplifier stage for signal amplification.

21. A process for amplifying a signal in a transmitting output stage, comprising:

preparing a signal;

selecting an amplification setting;

selecting an impedance matching as a function of the selected amplification setting;

amplifying the signal by the selected amplification factor;

changing the amplification setting;

changing the impedance matching by bridging elements responsible for the impedance matching;

where the selection of an amplification setting comprises:

providing a first amplifier stage with a first amplification factor;

providing an amplifier stage with a second amplification factor;

selecting both the first and the second amplifier stages at a first time for signal amplification, and selecting only one of the first or second amplifier stages at a second time for signal amplification.

\* \* \* \* \*

UNITED STATES PATENT AND TRADEMARK OFFICE
CERTIFICATE OF CORRECTION

PATENT NO. : 7,486,133 B2 Page 1 of 1
APPLICATION NO. : 11/584319
DATED : February 3, 2009
INVENTOR(S) : Winfried Bakalski It is certified that error appears in the above-identified patent and that said Letters Patent is hereby corrected as shown below:

Column 6, line 23, please replace "the respective levels" with --the respective power levels--

Signed and Sealed this

Twenty-fourth Day of March, 2009

JOHN DOLL
*Acting Director of the United States Patent and Trademark Office*